United States Patent
Cantone et al.

(10) Patent No.: US 9,209,037 B2
(45) Date of Patent: Dec. 8, 2015

(54) METHODS FOR FABRICATING INTEGRATED CIRCUITS INCLUDING SELECTIVELY FORMING AND REMOVING FIN STRUCTURES

(71) Applicant: GLOBALFOUNDRIES, Inc., Grand Cayman (KY)

(72) Inventors: Jason Richard Cantone, Mechanicville, NY (US); Linus Jang, Clifton Park, NY (US); Jin Cho, Palo Alto, CA (US); Ryan Ryoung-Han Kim, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/196,931

(22) Filed: Mar. 4, 2014

(65) Prior Publication Data
US 2015/0255299 A1  Sep. 10, 2015

(51) Int. Cl.
*H01L 21/311* (2006.01)
*H01L 21/308* (2006.01)

(52) U.S. Cl.
CPC ........ *H01L 21/3086* (2013.01); *H01L 21/3085* (2013.01)

(58) Field of Classification Search
USPC .................................................. 438/694–703
See application file for complete search history.

(56) References Cited

U.S. PATENT DOCUMENTS

| | | | | |
|---|---|---|---|---|
| 8,338,310 | B2 * | 12/2012 | Jung et al. | 438/717 |
| 8,932,957 | B2 * | 1/2015 | Shieh et al. | 438/700 |
| 2007/0161245 | A1 * | 7/2007 | Rathsack et al. | 438/689 |
| 2007/0249170 | A1 * | 10/2007 | Kewley | 438/706 |

* cited by examiner

*Primary Examiner* — Karen Kusumakar
(74) *Attorney, Agent, or Firm* — Ingrassia Fisher & Lorenz, P.C.

(57) ABSTRACT

Methods for fabricating integrated circuits are provided. In an embodiment, a method for fabricating an integrated circuit includes forming fin structures in a selected area of a semiconductor substrate. The method includes covering the fin structures and the semiconductor substrate with a mask and forming a trench in the mask to define no more than two exposed fin structures in the selected area. Further, the method includes removing the exposed fin structures to provide the selected area with a desired number of fin structures.

19 Claims, 11 Drawing Sheets

METHODS FOR FABRICATING INTEGRATED CIRCUITS INCLUDING SELECTIVELY FORMING AND REMOVING FIN STRUCTURES

TECHNICAL FIELD

The technical field generally relates to methods for fabricating integrated circuits, and more particularly relates to methods for fabricating integrated circuits including selectively forming and removing fin structures to provide desired numbers of fin-type field effect transistors (FinFETs) in selected locations.

BACKGROUND

FinFETs have emerged as an effective approach to support the scaling of integrated circuits, as FinFETs require less area than planar transistors. FinFETs utilize fin structures of semiconductor material that function as channels for the FinFETs. Fin structures are generally formed on a semiconductor substrate through typical semiconductor patterning processes.

The continued scaling of integrated circuits has generated a demand for methods for forming nanometer-sized features, such as fin structures, that are separated by nanometer-sized distances. As the limits of optical resolution are approached in current lithography processes, double patterning processes have been used to create critical dimensions (CD) and spaces that are beyond the capability of a single lithography step. Specifically, while a conventional lithographic process can be used to form a line-width equal to a minimum critical dimension associated with the lithographic process, a double patterning process can be used to form a line-width smaller than the minimum critical dimension. Double patterning techniques include "pitch split" (also called litho-etch litho-etch, or LELE) and self-aligned double patterning (SADP), also called sidewall image transfer (SIT). To obtain even smaller feature sizes and spacing, self-aligned quadruple patterning (SAQP) or double SIT techniques have been proposed.

Conventionally, fin structures are formed as a "sea of fins" across the entire semiconductor substrate under processing. Then, conventional processing is used to form block masks over selected fin structures and to etch those fin structures not covered by the block masks. During a typical fabrication process, a semiconductor substrate may have block masks of ten or more sizes positioned over fin structures in various selected areas of the substrate. Further conventional processing may include formation of a trench mask that exposes portions of the selected fin structures to define fin structure lengths and fin structure terminal locations on the semiconductor substrate. As integrated circuit features shrink, it becomes difficult to precisely form and position variably-sized block masks over selected fin structures.

Accordingly, it is desirable to provide methods for fabricating integrated circuits that provide for the formation of fin structures only in selected areas of semiconductor substrates. Further, it is desirable to provide methods for fabricating integrated circuits that use masks having trenches bounding non-selected fin structures for removal. In addition, it is desirable to provide methods for fabricating integrated circuits that use masks having trenches of no more than two critical dimensions to expose non-selected fin structures for removal. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In accordance with an exemplary embodiment, a method for fabricating an integrated circuit includes forming fin structures in a selected area of a semiconductor substrate. The method includes covering the fin structures and the semiconductor substrate with a mask and forming a trench in the mask to define no more than two exposed fin structures in the selected area. Further, the method includes removing the exposed fin structures to provide the selected area with a desired number of fin structures.

In another embodiment, a method for fabricating an integrated circuit includes forming fin structures in a plurality of selected areas of a semiconductor substrate and covering the fin structures and the semiconductor substrate with a first mask. The method also includes forming first trenches in the first mask. Each first trench exposes no more than two fin structures. Further, the method includes removing the fin structures that are exposed by the first trenches to provide each selected area with a desired number of fin structures. The method further includes forming a second mask overlying the semiconductor substrate and patterning the second mask to form a second trench extending perpendicular to the fin structures. The second trench exposes portions of the fin structures. The method etches the portions of the fin structures to define aligned ends of the fin structures.

In accordance with another embodiment, a method for fabricating an integrated circuit includes defining a first selected area and a second selected area of a semiconductor substrate. The first selected area and the second selected area share a boundary. The method includes forming a first group of fin structures and a second group of fin structures overlying the semiconductor substrate. The first group of fin structures is formed in the first selected area and the second selected area and the second group of fin structures is formed in the second selected area. The method further includes forming a first mask overlying the semiconductor substrate and patterning the first mask to form a trench extending perpendicular to the first group of fin structures and the second group of fin structures and overlying the boundary. The trench exposes middle portions of the first group of fin structures. The method etches the middle portions of the first group of fin structures exposed by the first mask.

BRIEF DESCRIPTION OF THE DRAWINGS

Embodiments of methods for fabricating integrated circuits including selectively forming and removing fin structures will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits including selectively forming and removing fin structures as claimed herein. Furthermore, there is no intention to be bound by any expressed or implied theory presented in the preceding technical field, background or brief summary, or in the following detailed description.

In accordance with the various embodiments herein, methods for fabricating integrated circuits including selectively forming and removing fin structures are provided. The methods described herein provide for forming a minimal number of fin structures in selected areas of semiconductor substrates to enable a limited removal of fin structures to achieve the desired number of fin structures. Further, embodiments of the methods described herein provide for etching non-selected fin structures using masks formed with trenches having uniform critical dimensions.

FIGS. 1-26 illustrate steps in accordance with embodiments of methods for fabricating integrated circuits 11. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

FIGS. 1-17 illustrate a method for forming fin structures in selected areas on a semiconductor substrate. The exemplary embodiment utilizes a self-aligned quadruple patterning (SAQP) process to form fin structures. In the exemplary embodiment of FIG. 1, a method for fabricating an integrated circuit 11 includes providing a semiconductor substrate 12. An exemplary semiconductor substrate 12 is formed from semiconductor material such as silicon, including the relatively pure silicon materials typically used in the semiconductor industry as well as silicon admixed with other elements, such as germanium and the like. Alternatively, the semiconductor substrate 12 can be realized as germanium, gallium arsenide, and the like, or the semiconductor substrate 12 can include layers of different semiconductor materials. In an exemplary embodiment the semiconductor substrate 12 is realized as a bulk silicon substrate; however, it may be realized as a silicon-on-insulator (SOI) substrate.

Figure 1:
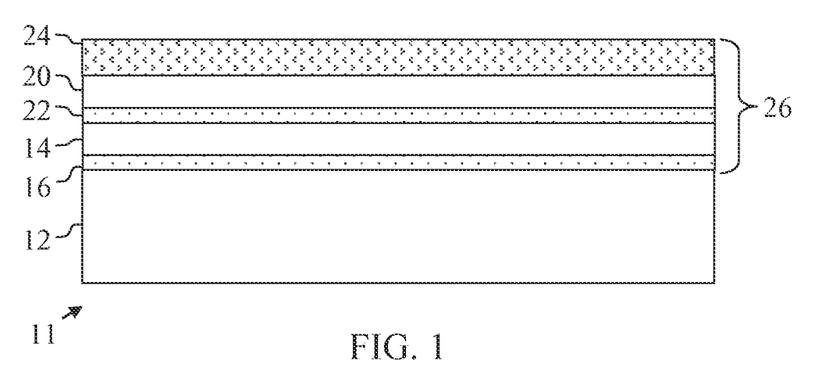
FIGS. 1-12 illustrate, in cross section, a portion of an integrated circuit and method steps for fabricating the integrated circuit using a self-aligned quadruple patterning process for forming fin structures and a process for removing non-selected fin structures in accordance with various embodiments herein.

As shown, a lower mandrel layer 14 is formed overlying the semiconductor substrate 12. As used herein "overlying" means "on" and "over". In this regard, the lower mandrel layer 14 may lie directly on the semiconductor substrate 12 such that it makes physical contact with the semiconductor substrate 12 or it may lie over the semiconductor substrate 12 such that another material layer, for example, a hard mask layer 16, is interposed between the semiconductor substrate 12 and the lower mandrel layer 14. Further, as used herein "overlying", "over", "upper", and "lower" describe the orientation and/or location of a feature or element within the consistent but arbitrary frame of reference illustrated by the drawings.

In an exemplary embodiment, the lower mandrel layer 14 is amorphous silicon, polycrystalline silicon, or another material suitable for use in required patterning steps. In an exemplary embodiment, the lower mandrel layer 14 is blanket-deposited by a plasma-enhanced chemical vapor deposition (PECVD) process, a low pressure chemical vapor deposition (LPCVD), or another chemical vapor deposition (CVD) process. An exemplary lower mandrel layer 14 has a thickness of about 80 nanometers (nm) to about 120 nm, such as about 100 nm. An exemplary hard mask layer 16 is deposited silicon nitride, silicon oxide, silicon oxynitride, amorphous carbon, a carbon-doped silica (SiCOH), or another material suitable for the patterning steps of the process. In an exemplary embodiment, the hard mask layer 16 is formed by blanket-deposition using, for example, a plasma-enhanced chemical vapor deposition process, a low pressure chemical vapor deposition, or another chemical vapor deposition process. An exemplary hard mask layer 16 has a thickness of about 25 nm to about 50 nm, such as about 40 nm.

As shown, an upper mandrel layer 20 is formed overlying the lower mandrel layer 14. The upper mandrel layer 20 may lie directly on the lower mandrel layer 14 or it may lie over the lower mandrel layer 14 such that another material layer, for example, a hard mask layer 22, is interposed between the lower mandrel layer 14 and the upper mandrel layer 20. In an exemplary embodiment, the upper mandrel layer 20 is amorphous silicon, polycrystalline silicon, or another material suitable for use in lithography steps. In an exemplary embodiment, the upper mandrel layer 20 is blanket-deposited by a plasma-enhanced chemical vapor deposition process, a low pressure chemical vapor deposition, or another chemical vapor deposition process. An exemplary upper mandrel layer 20 has a thickness of about 80 nm to about 120 nm, such as about 100 nm. An exemplary hard mask layer 22 is deposited silicon nitride, silicon oxide, silicon oxynitride, amorphous carbon, a carbon-doped silica (SiCOH), or another material suitable for the lithography steps of the process. An exemplary hard mask layer 22 is formed by blanket-deposition using, for example, a plasma-enhanced chemical vapor deposition process, a low pressure chemical vapor deposition, or another chemical vapor deposition process. An exemplary hard mask layer 22 has a thickness of about 25 nm to about 50 nm, such as about 40 nm. As further shown, a masking layer 24 may be formed over the upper mandrel layer 20. An exemplary masking layer 24 is photoresist, though another suitable patternable material may be used.

The hard mask layer 16, lower mandrel layer 14, hard mask layer 22, upper mandrel layer 20, and masking layer 24 are considered to form a mask stack 26. The mask stack 26 may include other layers, such as anti-reflective coating layers, etch stop layers, optical dispersive layers, or other desired layers interposed below or over the hard mask layer 16, lower mandrel layer 14, hard mask layer 22, upper mandrel layer 20, or masking layer 24. The mask stack 26 lies over the semiconductor substrate 12 and is processed to form a mask for patterning the semiconductor substrate 12 as described herein.

Figure 2:
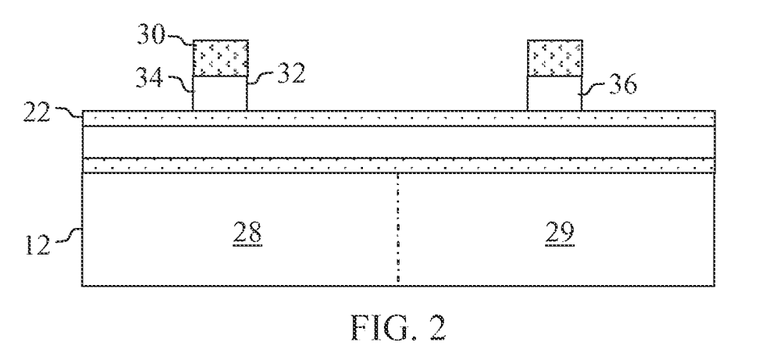

In FIG. 2, the semiconductor substrate 12 is shown to include two selected areas 28 and 29. For example, selected area 28 may be a designated area for an NMOS region and selected area 29 may be a designated area for a PMOS region. As further shown in FIG. 2, the masking layer 24 is exposed, developed or otherwise patterned in a lithographic process to form closed mask segments 30. The closed mask segments 30 selectively cover portions of the upper mandrel layer 20. An etch process is performed to etch exposed portions of the upper mandrel layer 20. In an exemplary embodiment, a reactive ion etch (RIE) is performed to etch the exposed portions of the upper mandrel layer 20. The etch process stops on the hard mask layer 22. As a result, upper mandrels 32, including a first upper mandrel 34 overlying the selected area 28 and a second upper mandrel 36 overlying the selected area 29, are formed over the hard mask layer 22. It is noted that a plurality of first upper mandrels 34 and/or second upper mandrels 36 may be formed having uniform critical dimensions and separated by uniform or variable distances as desired.

Figure 3:
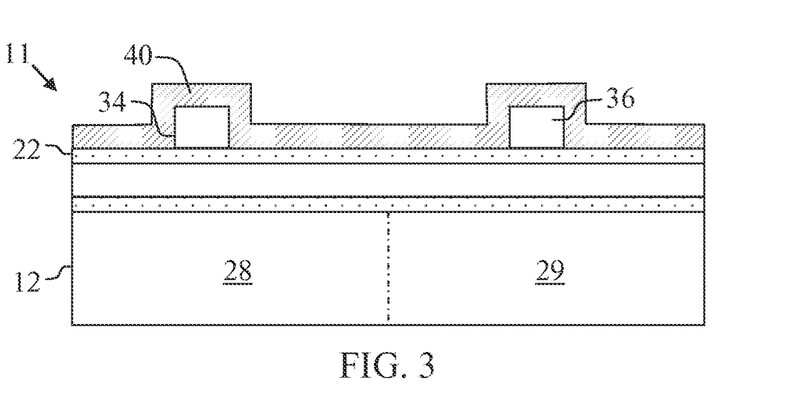

The method may continue in FIG. 3 with the removal of the closed mask segments 30 and the formation of a spacer-forming layer 40 over the upper hard mask layer 22, the first upper mandrel 34 and the second upper mandrel 36. An exemplary spacer-forming layer 40 is conformally deposited such as by atomic layer deposition (ALD), plasma-enhanced chemical vapor deposition, a low pressure chemical vapor deposition, or another chemical vapor deposition process. An exemplary spacer-forming layer 40 contacts the upper hard mask layer 22 and the sidewalls and upper surfaces of the upper mandrels 34 and 36 and encapsulates the upper mandrels 34 and 36. Spacer-forming layer 40 may be formed of silicon nitride, silicon dioxide, or any type of organic or inorganic material having etch selectivity with respect to upper mandrels 34 and 36.

Figure 4:
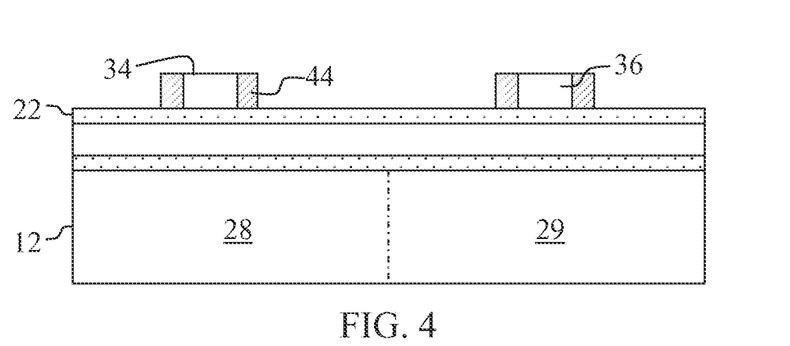

The spacer-forming layer 40 is etched to form upper sidewall spacers 44, as illustrated in FIG. 4. An exemplary etch uses an RIE process with chemistries based upon $CHF_3/O_2$ to etch silicon nitride, and $CHF_3$ or $CF_4$ to etch silicon oxynitride or silicon oxide. The upper sidewall spacers 44 are formed with a substantially uniform critical dimension. In an exemplary embodiment, the critical dimension of the upper sidewall spacers 44 is about 14 nm to about 30 nm. As shown, the upper sidewall spacers 44 surround each upper mandrel 34 and 36. In an exemplary embodiment, an etch is performed followed by planarization of both upper mandrels 34 and 36 and upper sidewall spacers 44.

Figure 5:
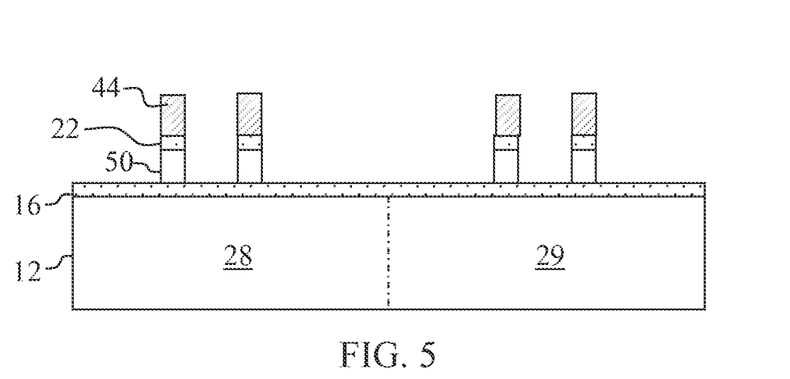

As illustrated in FIG. 5, the upper mandrels 34 and 36 are removed, leaving the upper sidewall spacers 44 on the upper hard mask layer 22. In an exemplary embodiment, the upper mandrels 34 and 36 are removed by a reactive ion etch selective to the upper mandrels 34 and 36 in relation to the upper sidewall spacers 44 and the upper hard mask layer 22. Then, the exposed portions of the upper hard mask layer 22 and the lower mandrel layer 14, i.e., those portions not directly underlying the upper sidewall spacers 44, are etched. For example, an anisotropic etch may be performed by a timed reactive ion etch process selective to the hard mask layer 22 and lower mandrel layer 14. As a result, lower mandrels 50 are formed from the lower mandrel layer 14 overlying the first hard mask layer 16. As shown, the lower mandrels 50 have a substantially uniform critical dimension.

Figure 6:
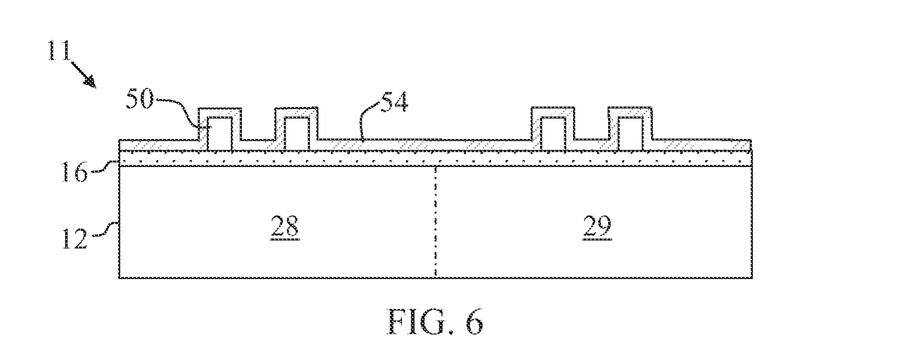

In an exemplary embodiment, the method continues, as illustrated in FIG. 6, with the removal of the etched portions of the upper hard mask layer 22 and upper sidewall spacers 44 from the lower mandrels 50. Then, a spacer-forming layer 54 is formed over the lower hard mask layer 16 and the lower mandrels 50. An exemplary spacer-forming layer 54 is conformally deposited such as by atomic layer deposition, plasma-enhanced chemical vapor deposition, a low pressure chemical vapor deposition, or another chemical vapor deposition process. An exemplary spacer-forming layer 54 contacts the lower hard mask layer 16 and the sidewalls and upper surfaces of the lower mandrels 50 and encapsulates the lower mandrels 50. Spacer-forming layer 54 may be formed of silicon nitride, silicon dioxide, or any type of organic or inorganic material having etch selectivity with respect to lower mandrels 50.

Figure 7:
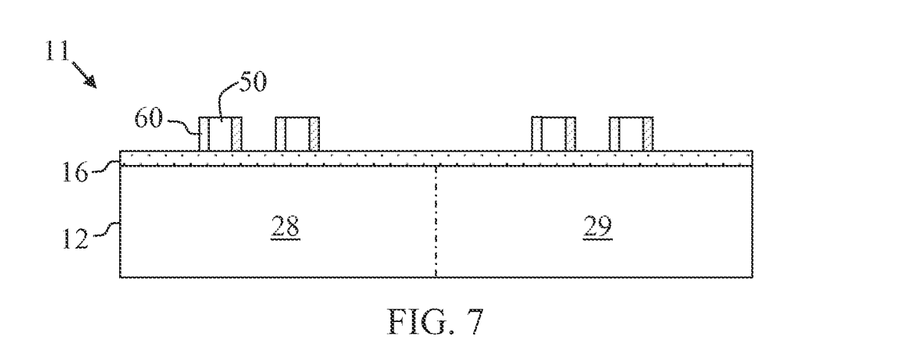

In FIG. 7, the spacer-forming layer 54 is etched to form lower sidewall spacers 60. An exemplary etch uses an RIE process with chemistries based upon $CHF_3/O_2$ to etch silicon nitride, and $CHF_3$ or $CF_4$ to etch silicon oxynitride or silicon oxide. The lower sidewall spacers 60 are formed with a substantially uniform critical dimension. In an exemplary embodiment, the critical dimension of the lower sidewall spacers 60 is about 10 nm to about 20 nm. As shown, the lower sidewall spacers 60 surround each lower mandrel 50. In an exemplary embodiment, an etch is performed followed by planarization of both lower mandrels 50 and lower sidewall spacers 60.

Figure 8:
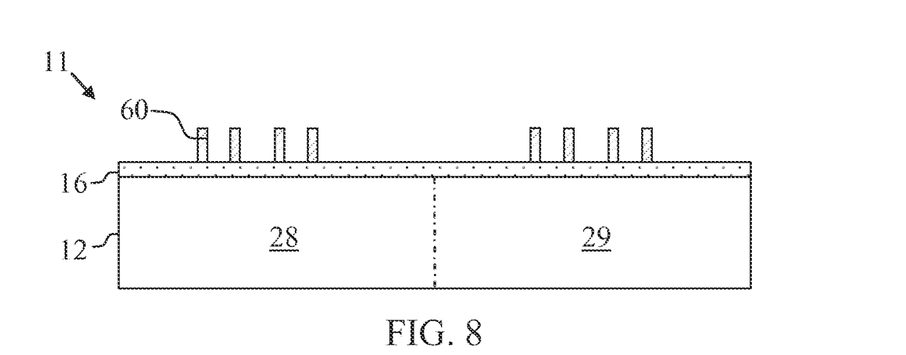

Next, as illustrated in FIG. 8, the lower mandrels 50 are removed leaving the lower sidewall spacers 60 on the lower hard mask layer 16. In an exemplary embodiment, the lower mandrels 50 are removed by a reactive ion etch selective to the lower mandrels 50 in relation to the lower sidewall spacers 60 and the lower hard mask layer 16.

Figure 9:
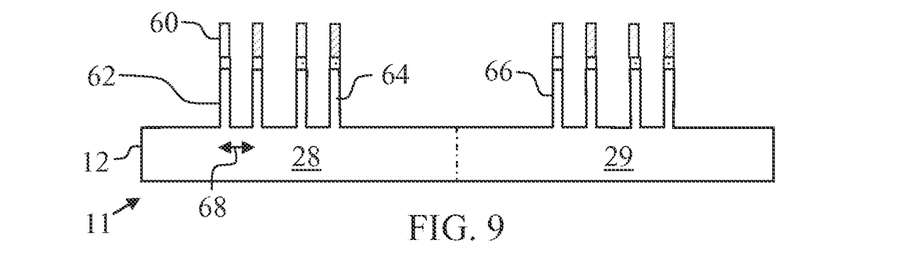

In FIG. 9, the exposed portions of the lower hard mask layer 16 and the semiconductor substrate 12, i.e., those portions not directly underlying the lower sidewall spacers 60, are etched. For example, an anisotropic etch may be performed by a timed reactive ion etch process selective to the lower hard mask layer 16 and semiconductor substrate 12. As a result, fin structures 62 are formed from the semiconductor substrate 12. As shown, the fin structures 62 include fin structures 64 formed over the selected area 28 and fin structures 66 formed over the selected area 29. The fin structures 62 are formed with a substantially uniform critical dimension. Further, the fin structures 62 in each selected area 28 and 29 are formed with a substantially uniform pitch, indicated by double headed arrow 68.

Figure 10:
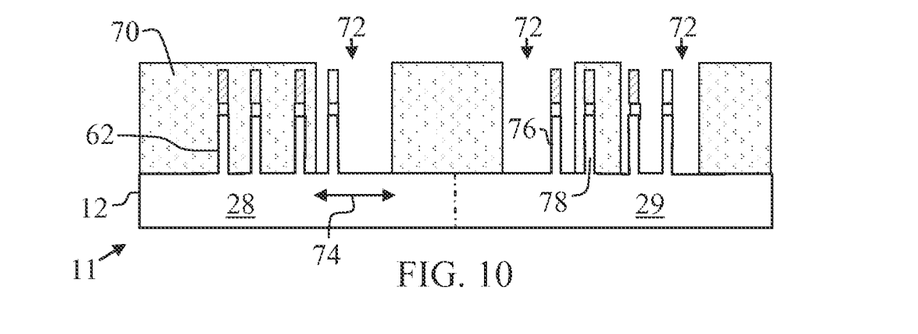
Figure 11:
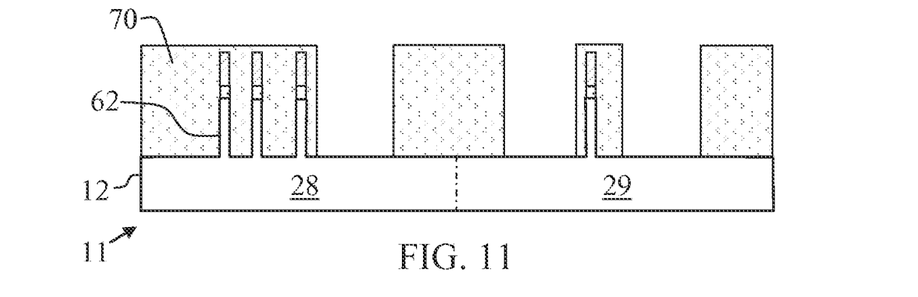
Figure 12:
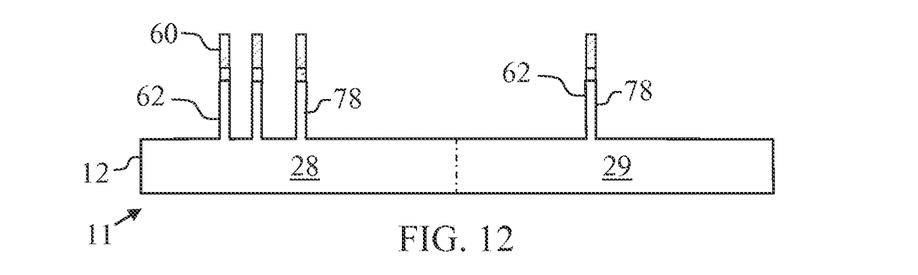

FIG. 9 illustrates the completion of the SAQP process for forming the fin structures 62. In FIGS. 10-12, additional processing is performed to remove non-selected fin structures to attain a desired number of fin structures 64 for each selected area 28 and 29. As shown in FIG. 10, a masking layer 70 is formed and covers the semiconductor substrate 12. An exemplary masking layer 70 is photoresist, though another suitable patternable material may be used. The masking layer 70 is exposed, developed or otherwise patterned in a lithographic process to form open trenches 72. In FIG. 9, the open trenches 72 have a uniform critical dimension, indicated by double-headed arrow 74. In exemplary embodiments, the trench critical dimension 74 is no more than two times the fin pitch 68. In other embodiments, the trench critical dimension 74 may equal the fin pitch 68. The open trenches 72 selectively expose non-selected fin structures 76 while selected fin structures 78 remained masked.

In FIG. 11, an etch process is performed to etch the exposed non-selected fin structures 76. In an exemplary embodiment, a reactive ion etch (RIE) is performed to etch the exposed non-selected fin structures 76. In FIG. 12, the masking layer 70 is removed. As a result of the fin structure removal process, each selected area 28 and 29 is provided with a desired number of fin structures 62, i.e., the number of selected fin structures 78. For example, selected area 28 may be an NMOS region provided with three fin structures 62, while selected area 29 may be a PMOS region provided with one fin structure 62.

Figure 13:
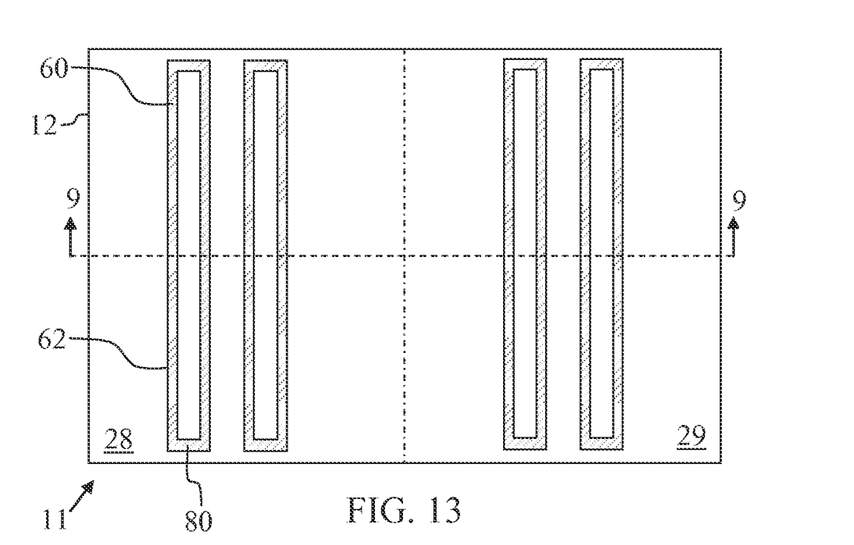
FIGS. 13-17 illustrate overhead views of the integrated circuit of FIGS. 1-12 and methods steps for removing non-selected fin structures and portions of selected fin structures.

FIGS. 13-17 illustrate the fin structure removal process of FIGS. 10-12 through an overhead view to provide for further understanding of the process. FIG. 13 is an overhead view of the partially fabricated integrated circuit 11 of FIG. 9 (FIG. 9 illustrates a cross-sectional view of the partially fabricated integrated circuit along line 9-9 in FIG. 13). In FIG. 13, the semiconductor substrate 12 has been etched with the lower sidewall spacers 60 serving as an etch mask. As shown, the lower sidewall spacers 60 and the underlying fin structures 62 have a rectangular shape with closed terminal portions 80.

Figure 14:
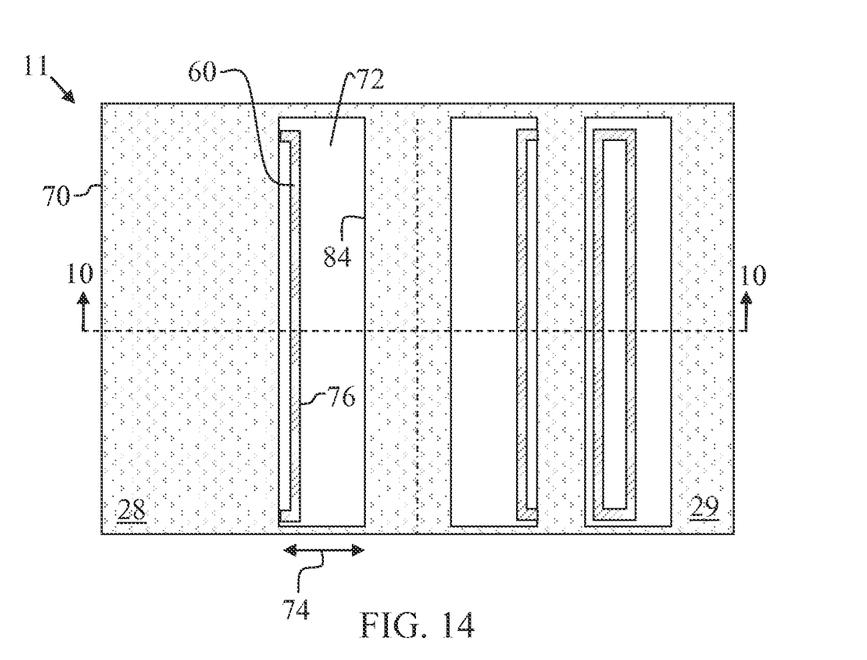

FIG. 14 is an overhead view of the partially fabricated integrated circuit 11 of FIG. 10 (FIG. 10 illustrates a cross-sectional view of the partially fabricated integrated circuit 11 along line 10-10 in FIG. 14). As shown, each open trench 72 formed in the masking layer 70 is completely bounded by trench walls 84. Further, each open trench 72 has the same critical dimension 74. Each open trench 72 exposes non-selected fin structures 76 lying under the exposed portion of lower sidewall spacers 60.

Figure 15:
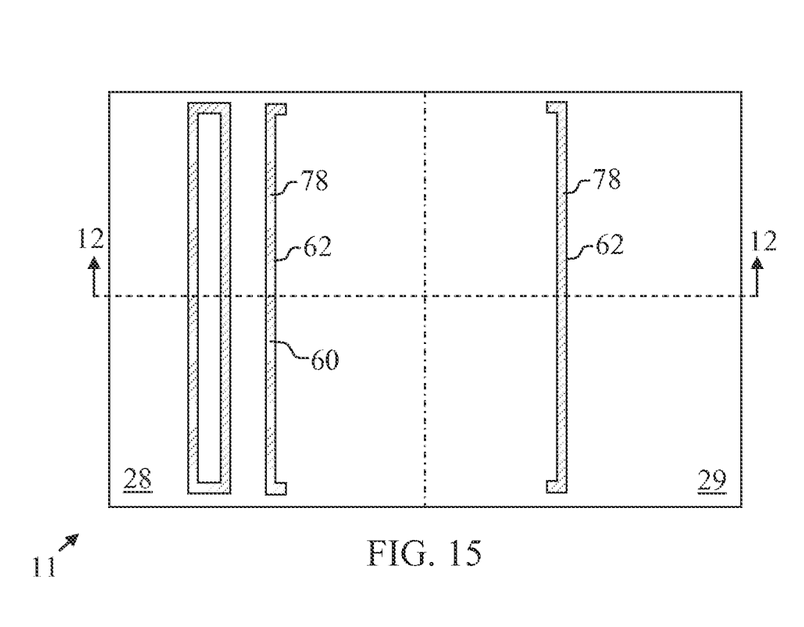

FIG. 15 is an overhead view of the partially fabricated integrated circuit 11 of FIG. 12 (FIG. 12 illustrates a cross-sectional view of the partially fabricated integrated circuit along line 12-12 in FIG. 15). As in FIG. 12, the non-selected fin structures 76 are etched and the masking layer 70 is removed. As a result, each selected area 28 and 29 is provided with a desired number of selected fin structures 62, i.e., the number of selected fin structures 78.

Figure 16:
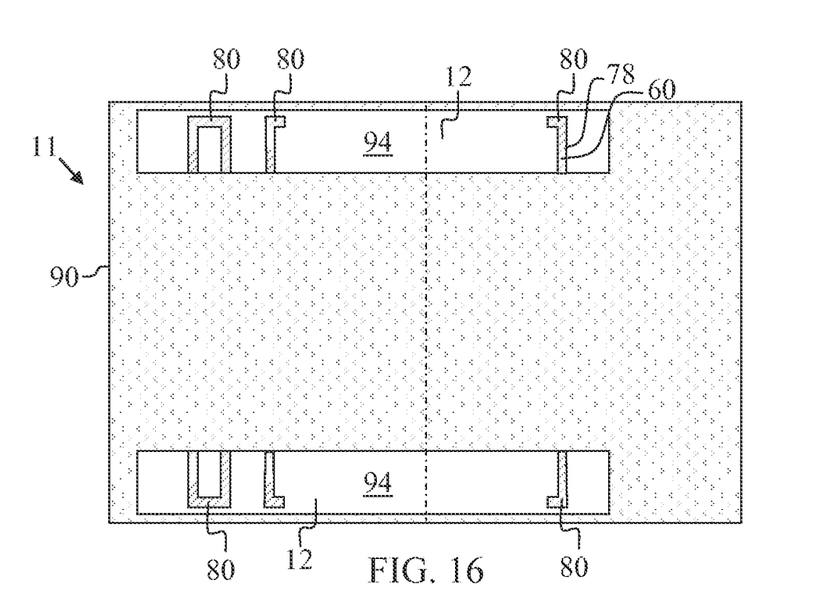

Further processing of the selected fin structures 78 is illustrated in FIG. 16. As shown, a masking layer 90 is formed and covers the semiconductor substrate 12. An exemplary masking layer 90 is photoresist, though another suitable patternable material may be used. The masking layer 90 is exposed, developed or otherwise patterned in a lithographic process to form open trenches 94. In FIG. 16, the open trenches 94 selectively expose portions of the selected fin structures 78. Specifically, the open trenches 94 selectively expose the terminal portions 80 of the lower sidewall spacers 60 and the underlying selected fin structures 78 while the remaining portions of the selected fin structures 78 remain masked.

Figure 17:
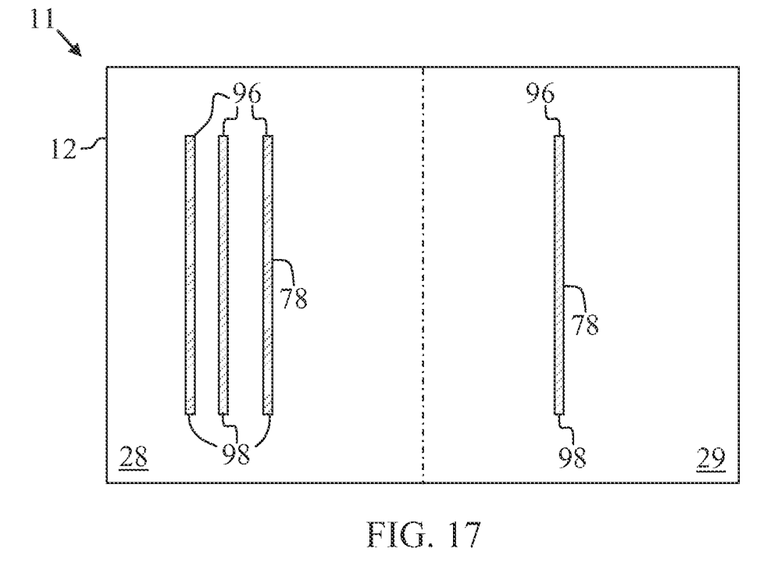

The terminal portions 80 of the spacers and the underlying selected fin structures 78 are etched in FIG. 17. Further, the masking layer 90 is removed from the partially fabricated integrated circuit 11. Accordingly, formation of the selected fin structures 78 is completed and the selected fin structures 78 are provided with aligned first ends 96 and aligned second ends 98. While the illustrated embodiment etches the terminal portions 80 after etching the non-selected fin structures 76, the terminal portions 80 may be etched before etching the non-selected fin structures 76. In such embodiments, the masking layer 90 is formed over the semiconductor substrate 12 and processed to etch the terminal portions 80 before the masking layer 70 is formed over the semiconductor substrate 12 and processed to etch the non-selected fin structures 76.

Figure 18:
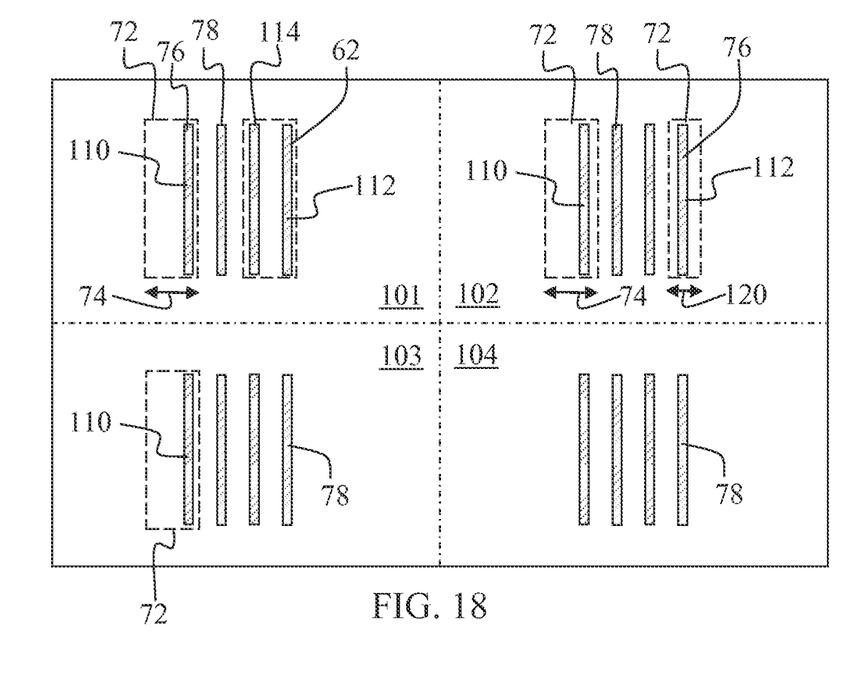
FIG. 18 is an overhead schematic illustrating the removal of varying numbers of non-selected fin structures to provided desired numbers of fin structures in exemplary selected areas.

FIG. 18 is a schematic illustrating that any number of selected fin structures 78 can be attained through the use of SAQP and the removal of non-selected fin structures 76 using a mask formed with open trenches 72 having a uniform critical dimension 74. In exemplary selected areas 101, 102, 103 and 104, four fin structures 62 are formed using a SAQP process with a single upper mandrel. Selected area 101 requires a single fin structure. Therefore, an open trench 72 may be formed over terminal fin structure 110 and an open trench 72 may be formed over the other terminal fin structure 112 and its adjacent fin 114 to provide for removal of three fin structures.

Selected area 102 requires two fin structures. In an exemplary embodiment, an open trench 72 is formed over terminal fin structure 110 and an open trench 72 is formed over terminal fin 112 for their removal to provide selected area 102 with two selected fin structures 78. In the exemplary embodiment shown in FIG. 18, the open trench 72 formed over the terminal fin structure 112 has a critical dimension, indicated by double headed arrow 120, that is less than critical dimension 74. For example, critical dimension 120 may be substantially equal to the fin pitch 68 (as shown in FIG. 9). In an exemplary embodiment, all open trenches 72 formed to expose non-selected fin structures 76 are provided with either critical dimension 74 or critical dimension 120 to provide for uniformity in processing. In other embodiments, all open trenches 72 formed to expose non-selected fin structures 76 are provided with critical dimension 74. Also, while the embodiment for removing non-selected fin structures 76 in selected area 102 includes the use of two open trenches 72, a single open trench 72 may alternatively expose two non-selected fin structures 76.

Selected area 103 requires three fin structures. As shown, an open trench 72 is formed over the terminal fin structure 110 for removal, leaving three selected fin structures 78. Selected area 104 requires four fin structures. As a result, no fin structure removal is necessary after formation of selected fin structures 78 in selected area 104. Selected areas requiring more than four fin structures may be processed according to the examples of selected areas 101 through 104, albeit with the formation of 8, 12, 16 or more fin structures through a SAQP process using more upper mandrels, as is well understood. For example, five fin structures may be formed in a selected area by forming eight fin structures through an SAQP process, and by removing a terminal fin structure 110 and the other terminal fin structure 112 and its adjacent fin structure 114, as detailed with respect to selected area 101 above.

While the embodiments described above illustrate the use of a SAQP process for forming fin structures, it is contemplated that other fin formation processes may be used. For example, a self-aligned double patterning (SADP) process may be used to form fin structures in multiples of two. In such a process the semiconductor substrate 12 is etched using the upper sidewall spacers 44 of FIG. 5 as a mask.

Figure 19:
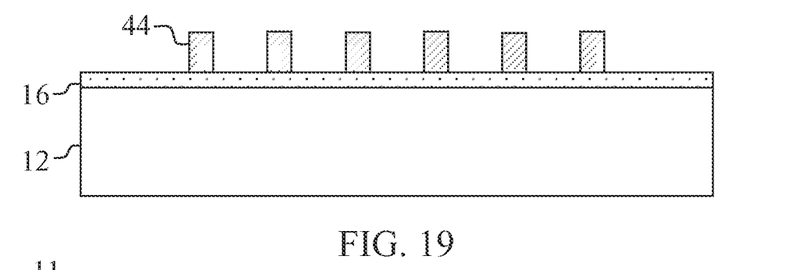
FIGS. 19-20 illustrate, in cross section, a portion of an integrated circuit and method steps for fabricating the integrated circuit using a self-aligned double patterning process in accordance with various embodiments herein.

FIGS. 19-26 illustrate an exemplary embodiment in which an SADP process is used to form fin structures. In FIG. 19, upper sidewall spacers 44 are formed overlying a hard mask layer 16 in accordance with the steps described above in relation to FIGS. 1-5. The exposed portions of the hard mask layer 16 and underlying portions of the semiconductor substrate 12 are etched in FIG. 20 using the upper sidewall spacers 44 as a mask. For example, an anisotropic etch may be performed by a timed reactive ion etch process selective to the hard mask layer 16 and semiconductor substrate 12. As a result, fin structures 62 are formed from the semiconductor substrate 12. As shown, the fin structures 62 have a substantially uniform critical dimension.

Figure 20:
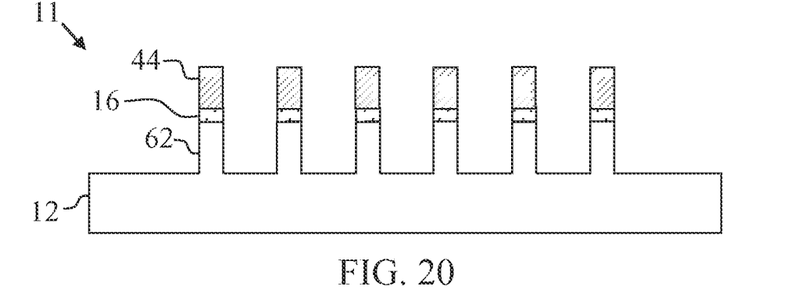
Figure 21:
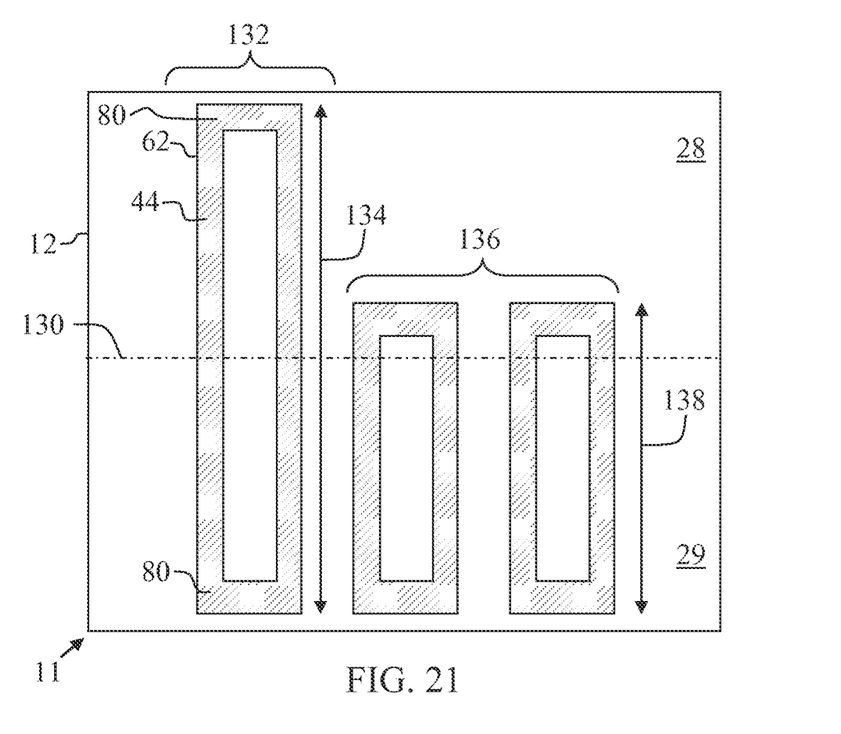
FIGS. 21-26 illustrate overhead views of the integrated circuit of FIGS. 19-20 and methods steps for removing non-selected fin structures and portions of selected fin structures.

FIG. 21 is an overhead view of the partially fabricated integrated circuit 11 of FIG. 20. As shown, the semiconductor substrate 12 includes a selected area 28 and a selected area 29 that share a boundary 130. The fin structures 62 and upper sidewall spacers 44 include closed terminal portions 80. Further, the fin structures 62 underlying upper sidewall spacers 44 extend in a direction perpendicular to the boundary 130, and cross over the boundary 130. As shown, a first group 132 of fin structures 62 extends for a length, indicated by double headed arrow 134. A second group 136 of fin structures 62 extends for a length, indicated by double headed arrow 138, that is shorter than length 134. The first group 132 and second group 136 of fin structures 62 are formed with different lengths 134 and 138 via the formation of mandrels 32 having different lengths in FIG. 2, and the subsequent processing of FIGS. 2-5 and 19-21.

Figure 22:
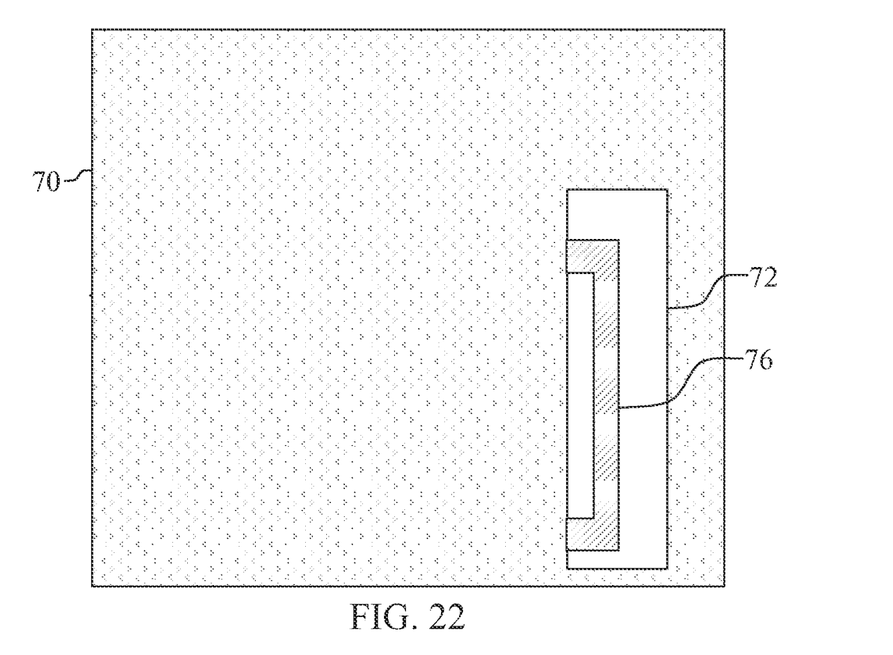

Additional processing is performed in FIG. 22 to remove non-selected fin structures 76. A masking layer 70 is formed and covers the semiconductor substrate 12. An exemplary masking layer 70 is photoresist, though another suitable patternable material may be used. The masking layer 70 is exposed, developed or otherwise patterned in a lithographic process to form an open trench 72. The open trench 72 selectively exposes non-selected fin structure 76 while selected fin structures remained masked.

Figure 23:
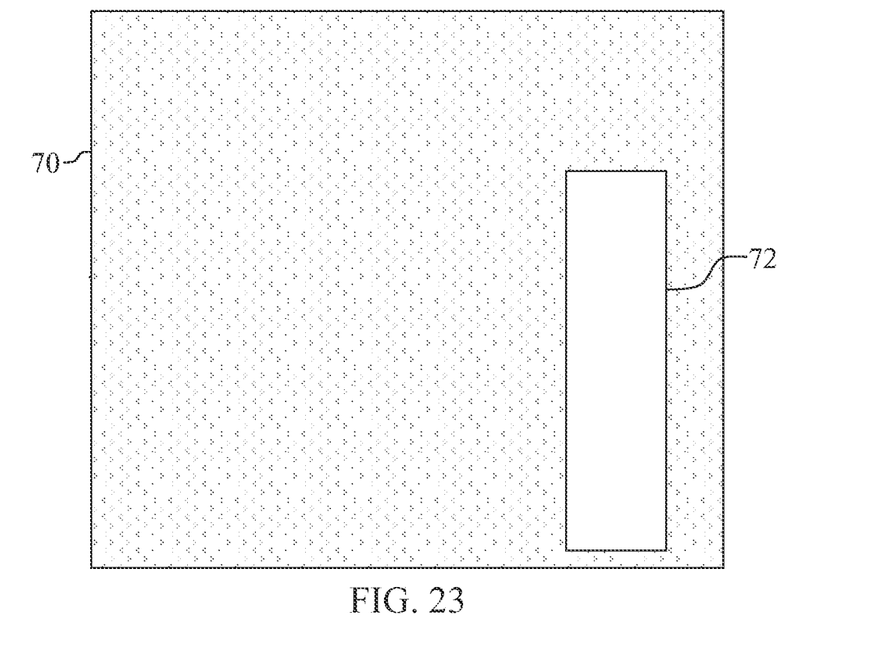
Figure 24:
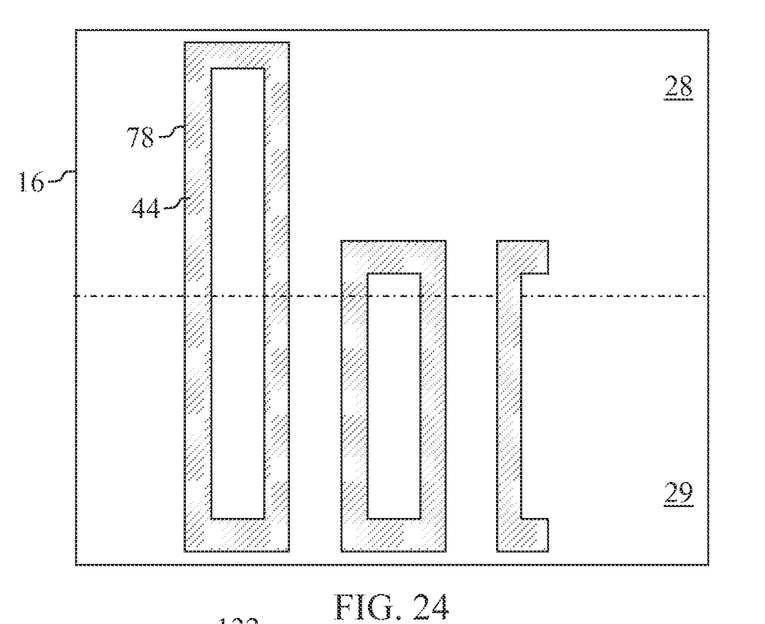

In FIG. 23, an etch process is performed to etch the exposed non-selected fin structure 76. In an exemplary embodiment, a reactive ion etch (RIE) is performed to etch the exposed non-selected fin structure 76. Then, the masking layer 70 is removed as shown in FIG. 24, revealing the upper sidewall spacers 44 and underlying selected fin structures 78.

Figure 25:
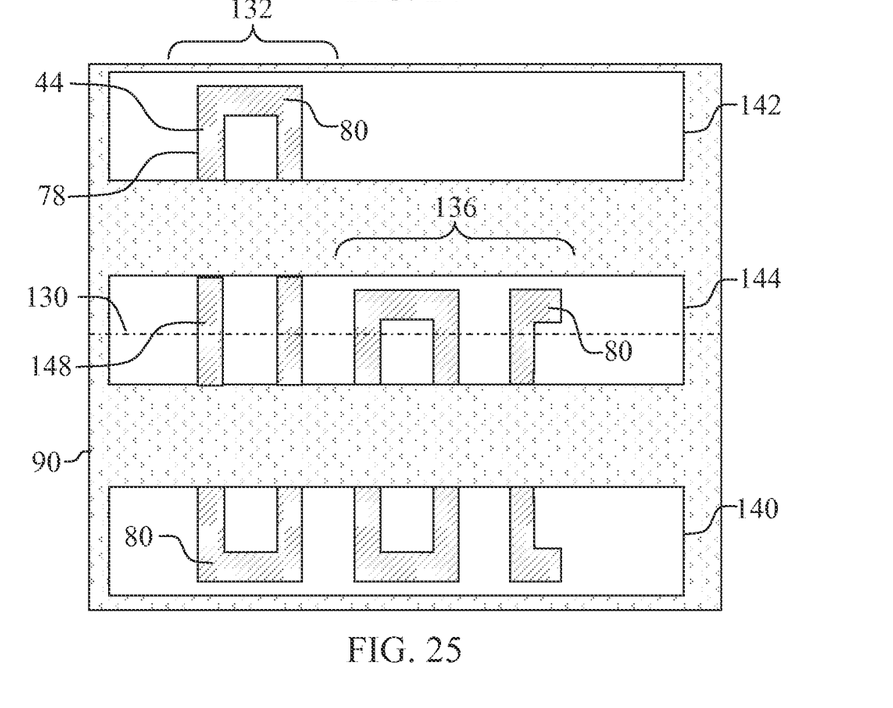

Further processing in FIG. 25 includes the formation of a masking layer 90 that covers the semiconductor substrate 12. An exemplary masking layer 90 is photoresist, though another suitable patternable material may be used. The masking layer 90 is exposed, developed or otherwise patterned in a lithographic process to form open trenches 140, 142 and 144 that selectively expose portions of the selected fin structures 78. Specifically, open trench 140 exposes terminal portions 80 of the upper sidewall spacers 44 and the underlying selected fin structures 78 in the first group 132 and second group 136 of fin structures. Open trench 142 exposes terminal portions 80 of the upper sidewall spacers 44 and the underlying selected fin structures 78 in the first group 132 of fin structures.

Open trench 144 exposes middle portions 148 of the upper sidewall spacers 44 and the underlying selected fin structures 78 in the first group 132 of fin structures as well as terminal portions 80 of the upper sidewall spacers 44 and the underlying selected fin structures 78 in the second group 136 of fin structures. As shown, open trench 144 lies over the boundary 130.

Figure 26:
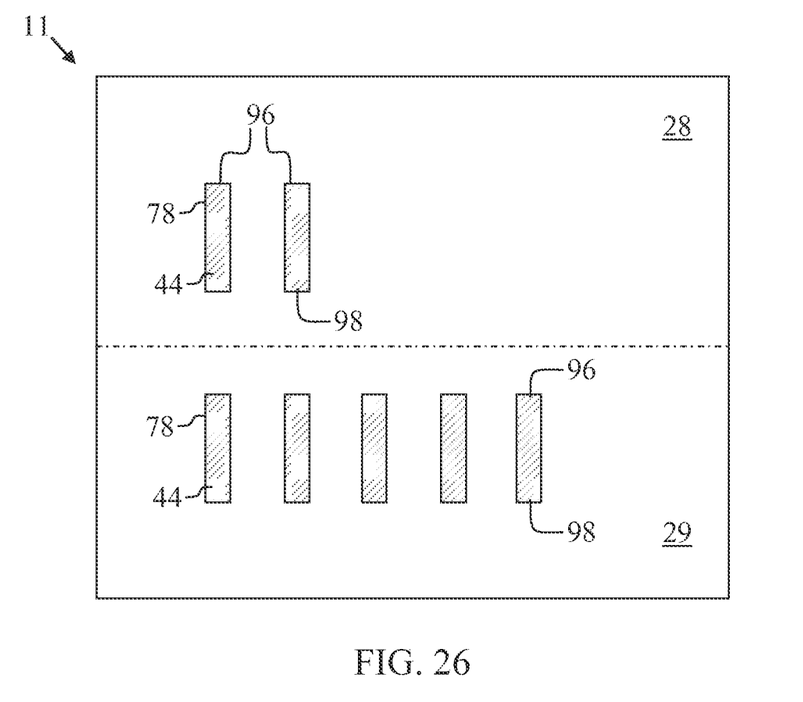

The exposed terminal portions 80 and middle portions 148 of the upper sidewall spacers 44 and the underlying selected fin structures 78 are etched in FIG. 26. Further, the masking layer 90 is removed from the partially fabricated integrated circuit 11. Accordingly, formation of the selected fin structures 78 in the selected area 28 and the selected area 29 is completed. The selected fin structures 78 in selected area 28 are provided with aligned first ends 96 and aligned second ends 98, and the selected fin structures 78 in selected area 29 are provided with aligned first ends 96 and aligned second ends 98. It is noted that etching the middle portions 148 of the selected fin structures 78 in the first group 132 of fin structures results in the formation of the selected fin structures 78 in the selected area 28 as well as two of the selected fin structures 78 in the selected area 29. While the illustrated embodiment etches the terminal portions 80 and middle portions 148 after etching the non-selected fin structures 76, the terminal portions 80 and middle portions 148 may be etched before etching the non-selected fin structures 76. In such embodiments, the masking layer 90 is formed over the semiconductor substrate 12 and processed to etch the terminal portions 80 and middle portions 148 before the masking layer 70 is formed over the semiconductor substrate 12 and processed to etch the non-selected fin structures 76.

Further processing of the partially fabricated integrated circuit 11 of FIG. 17 or 26 may include the removal of spacers overlying the fin structures, as well as the formation of gate structures overlying the ends 96 and 98 of selected fin structures 78, source/drain regions, stress material, contacts, and interconnect structures, as is known in integrated circuit fabrication.

The integrated circuit fabrication methods described herein provide for the precise formation and etching of fin structures to attain desired numbers and locations of fin structures in selected areas. The formation of a limited number of fin structures in selected areas allows for the use of masks formed with trenches having uniform critical dimensions for the limited removal of one or two fin structures. Such masks allow for improved precision over conventional, variable-sized block masks.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, the method comprising:

forming a group of fin structures in a selected area of a semiconductor substrate, wherein the group includes two terminal fin structures and non-terminal fin structures;

covering the group of fin structures and the semiconductor substrate with a mask;

forming at least one trench in the mask to define at least one exposed terminal fin structure in the selected area;

removing the at least one exposed terminal fin structure to provide the selected area with a desired number of fin structures;

forming a second mask overlying the semiconductor substrate, wherein the selected area includes a first portion and a second portion that share a boundary, wherein forming the group of fin structures comprises forming a first group of fin structures in the first portion and the second portion and forming a second group of fin structures in the second portion;

patterning the second mask to form a trench extending perpendicular to the first group of fin structures and the second group of fin structures and overlying the boundary, wherein the trench exposes middle portions of the first group of fin structures; and etching the middle portions of the first group of fin structures exposed by the second mask.

2. The method of claim 1 wherein:

forming at least one trench in the mask to define at least one exposed fin structure in the selected area comprises forming a first trench in the mask to define a first exposed terminal fin structure in the selected area and forming a second trench in the mask to define a second exposed terminal fin structure; and removing the at least one exposed terminal fin structure to provide the selected area with a desired number of fin structures comprises removing the first exposed terminal fin structure and the second exposed terminal fin structure to provide the selected area with a desired number of fin structures.

3. The method of claim 1 wherein:

forming at least one trench in the mask to define at least one exposed terminal fin structure in the selected area comprises forming a first trench in the mask to define a first exposed terminal fin structure and an exposed adjacent non-terminal fin structure in the selected area; and removing the at least one exposed terminal fin structure to provide the selected area with a desired number of fin structures comprises removing the exposed terminal fin structure and the exposed adjacent non-terminal fin structure to provide the selected area with a desired number of fin structures.

4. The method of claim 1 wherein:
forming at least one trench in the mask to define at least one exposed terminal fin structure in the selected area comprises forming a first trench in the mask to define a first exposed terminal fin structure and an exposed adjacent non-terminal fin structure in the selected area and forming a second trench in the mask to define a second exposed terminal fin structure; and
removing the at least one exposed fin structure to provide the selected area with a desired number of fin structures comprises removing the first exposed terminal fin structure, the exposed adjacent non-terminal fin structure, and the second exposed terminal fin structure to provide the selected area with a desired number of fin structures.

5. The method of claim 1 wherein:
forming at least one trench in the mask to define at least one exposed terminal fin structure in the selected area comprises forming at least two trenches in the mask and defining each trench with a same critical dimension.

6. The method of claim 1 wherein forming at least one trench in the mask to define at least one exposed terminal fin structure in the selected area comprises forming a first trench in the mask to define a first exposed terminal fin structure and an exposed adjacent non-terminal fin structure in the selected area and forming a second trench in the mask to define a second exposed terminal fin structure, wherein the first trench and the second trench have a same critical dimension.

7. A method for fabricating an integrated circuit, the method comprising:
forming fin structures in a plurality of selected areas of a semiconductor substrate;
covering the fin structures and the semiconductor substrate with a first mask;
forming first trenches in the first mask, wherein each first trench exposes no more than two fin structures;
removing the fin structures that are exposed by the first trenches to provide each selected area with a desired number of fin structures;
forming a second mask overlying the semiconductor substrate;
patterning the second mask to form a second trench extending perpendicular to the fin structures, wherein the second trench exposes portions of the fin structures; and
etching the portions of the fin structures to define aligned ends of the fin structures.

8. The method of claim 7 wherein forming a second mask overlying the semiconductor substrate comprises forming a second mask overlying the semiconductor substrate after removing the fin structures that are exposed by the first trenches.

9. The method of claim 7 wherein:
forming fin structures in a plurality of selected areas of a semiconductor substrate comprises performing a self-aligned double patterning process to form the fin structures; and
forming first trenches in the first mask, wherein each first trench exposes no more than two fin structures comprises forming each first trench in the first mask to expose no more than one fin structure.

10. The method of claim 7 wherein:
forming fin structures in a plurality of selected areas of a semiconductor substrate comprises performing a self-aligned quadruple patterning process to form the fin structures; and
forming first trenches in the first mask comprises forming each first trench in the first mask to expose one or two fin structures.

11. The method of claim 7 wherein:
forming fin structures in a plurality of selected areas of a semiconductor substrate comprises performing a self-aligned quadruple patterning process to form the fin structures; and
forming first trenches in the first mask comprises forming each first trench in the first mask to expose one or two fin structures and forming no more than two first trenches over each selected area.

12. The method of claim 7 wherein:
forming fin structures in a plurality of selected areas of a semiconductor substrate comprises defining a fin pitch; and
forming first trenches in the first mask comprises defining each trench critical dimension as being no more than two times the fin pitch.

13. The method of claim 7 wherein:
forming fin structures in a plurality of selected areas of a semiconductor substrate comprises defining a fin pitch; and
forming first trenches in the first mask comprises forming each first trench with either a first critical dimension or a second critical dimension, wherein the first critical dimension is no more than two times the fin pitch and the second critical dimension is no more than two times the fin pitch.

14. The method of claim 7 wherein:
forming fin structures in a plurality of selected areas of a semiconductor substrate comprises defining a fin pitch; and
forming first trenches in the first mask comprises forming each first trench with either a first critical dimension or a second critical dimension, wherein the first critical dimension is substantially equal to the fin pitch and the second critical dimension is no more than two times the fin pitch.

15. A method for fabricating an integrated circuit, the method comprising:
defining a first selected area and a second selected area of a semiconductor substrate, wherein the first selected area and the second selected area share a boundary;
forming a first group of fin structures and a second group of fin structures overlying the semiconductor substrate, wherein the first group of fin structures are formed in the first selected area and the second selected area and wherein the second group of fin structures are formed in the second selected area;
forming a first mask overlying the semiconductor substrate;
patterning the first mask to form a trench extending perpendicular to the first group of fin structures and the second group of fin structures and overlying the boundary, wherein the trench exposes middle portions of the first group of fin structures; and
etching the middle portions of the first group of fin structures exposed by the first mask.

16. The method of claim 15 wherein etching the middle portions of the first group of fin structures exposed by the first mask comprises defining first aligned ends of fin structures in the first selected area and second aligned ends of fin structures in the second selected area.

17. The method of claim 15 wherein:
patterning the first mask to form a trench comprises forming the trench to expose terminal portions of the second group of fin structures; and
etching the middle portions of the first group of fin structures exposed by the first mask comprises etching the terminal portions of the second group of fin structures exposed by the first mask.

18. The method of claim 15 wherein forming a first group of fin structures and a second group of fin structures comprises defining a fin pitch; and wherein the method further comprises:
covering the first group of fin structures, the second group of fin structures, and the semiconductor substrate with a second mask;
forming a trench in the second mask to define no more than two exposed fin structures and defining a trench critical dimension of no more than two times the fin pitch; and
removing the exposed fin structures.

19. The method of claim 15 wherein forming a first group of fin structures and a second group of fin structures comprises defining a fin pitch; and wherein the method further comprises:
covering the first group of fin structures, the second group of fin structures, and the semiconductor substrate with a second mask;
forming a trench in the second mask to define no more than two exposed fin structures and defining a trench critical dimension substantially equal to the fin pitch; and
removing the exposed fin structures.

* * * * *